United States Patent
Onodera

(10) Patent No.: US 8,759,157 B2
(45) Date of Patent: Jun. 24, 2014

(54) HEAT DISSIPATION METHODS AND STRUCTURES FOR SEMICONDUCTOR DEVICE

(71) Applicant: Spansion LLC, Sunnyvale, CA (US)

(72) Inventor: Masanori Onodera, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/966,069

(22) Filed: Aug. 13, 2013

(65) Prior Publication Data

US 2013/0337612 A1   Dec. 19, 2013

Related U.S. Application Data

(62) Division of application No. 12/004,960, filed on Dec. 20, 2007, now Pat. No. 8,531,019.

(30) Foreign Application Priority Data

Dec. 27, 2006   (JP) .................. 2006-353413

(51) Int. Cl.
*H01L 21/48*   (2006.01)
*H01L 23/02*   (2006.01)
*H01L 23/48*   (2006.01)
*H01L 23/367*   (2006.01)
*H01L 23/36*   (2006.01)
*H01L 33/64*   (2010.01)
*H01L 23/40*   (2006.01)

(52) U.S. Cl.
CPC ............. *H01L 23/367* (2013.01); *H01L 23/36* (2013.01); *H01L 23/3672* (2013.01); *H01L 33/648* (2013.01); *H01L 2023/4068* (2013.01); *H01L 2023/4037* (2013.01); *H01L 2023/4062* (2013.01)
USPC ............. 438/122; 438/26; 438/108; 438/109; 257/676; 257/686; 257/692; 257/777; 257/E21.101; 257/E21.503; 257/E21.505; 257/E21.506; 257/E23.067; 257/E23.069

(58) Field of Classification Search
CPC ............................ H01L 23/36; H01L 23/367
USPC ............ 438/26, 108, 109, 122; 257/676, 686, 257/692, 777, E21.101, E21.503, E21.505, 257/E21.506, E23.067, E23.069
See application file for complete search history.

(56) References Cited

U.S. PATENT DOCUMENTS

| | | | |
|---|---|---|---|
| 6,772,511 B2 * | 8/2004 | Nose ................................ | 29/832 |
| 7,148,554 B2 * | 12/2006 | Nah et al. ....................... | 257/532 |
| 7,582,496 B2 * | 9/2009 | Lee et al. ......................... | 438/26 |
| 2004/0222433 A1 * | 11/2004 | Mazzochette et al. .......... | 257/99 |
| 2006/0198162 A1 * | 9/2006 | Ishidu et al. ................... | 362/623 |

* cited by examiner

Primary Examiner — Dao H Nguyen

(57) ABSTRACT

A semiconductor device with efficient heat dissipating structures is disclosed. The semiconductor device includes a first semiconductor chip that is flip-chip mounted on a first substrate, a heat absorption portion that is formed between the first semiconductor chip and the first substrate, an outer connection portion that connects the first semiconductor chip to an external device and a heat conduction portion formed between the heat absorption portion and the outer connection portion to dissipate heat generated by the first semiconductor chip.

13 Claims, 10 Drawing Sheets

HEAT DISSIPATION METHODS AND STRUCTURES FOR SEMICONDUCTOR DEVICE

CROSS-REFERENCE TO RELATED APPLICATIONS

This application is a Divisional Application of and claims priority to U.S. patent application Ser. No. 12/004,960, filed on Dec. 20, 2007, titled "HEAT DISSIPATION METHODS AND STRUCTURES FOR SEMICONDUCTOR DEVICE," by Onodera, which claims priority from Japanese patent application 2006-353413, filed on Dec. 27, 2006, which are herein incorporated by reference.

FIELD OF TECHNOLOGY

This invention generally relates to a semiconductor device, and in particular, relates to heat dissipation methods and structures for semiconductor devices.

BACKGROUND

FIG. 1 illustrates a cross sectional view of a semiconductor device based on Package-on-Package (PoP) technology. As shown in FIG. 1, a first semiconductor chip 20 is flip-chip mounted on a bonding pad 24 with a bump 22 made of a conductive material. The bonding pad 24 is formed on a first substrate 10 that is a wiring substrate made of glass epoxy. The first semiconductor chip 20 is fixed to the first substrate 10 with an under fill 25 that is made of an epoxy-based thermosetting resin or an epoxy resin in which an anisotropic conductive particle (e.g., an anisotropic conductive film or an anisotropic conductive paste) is dispersed. A land electrode 26 is electrically coupled to a second substrate 30 with a solder ball 32. A land electrode 14 is electrically coupled to the bonding pad 24 and to the land electrode 26 with a connection portion 18. A solder resist 28 and a solder resist 16 on both sides of the first substrate 10 prevent the solder from attaching to the surface of the first substrate 10 when solder balls 12 are formed.

The second substrate 30 is a wiring substrate. A land electrode 34 is formed on a face of the second substrate 30 toward the first semiconductor chip 20. The second substrate 30 is electrically coupled to the first substrate 10 with the solder ball 32. A solder resist 35 prevents the solder ball 32 from attaching to a surface of the second substrate 30. A second semiconductor chip 40 is stacked on the second substrate 30 using a die attach 45. A third semiconductor chip 50 is stacked above the second semiconductor chip 40 using a die attach 55. A bonding pad 36 is also on the second substrate 30 and is electrically coupled to the second semiconductor chip 40 and the third semiconductor chip 50 with a wire 42 and a wire 52, respectively. The bonding pad 36 is electrically coupled to the land electrode 34 with a connection portion 38. The second semiconductor chip 40 and the third semiconductor chip 50 are sealed with a sealing resin portion 60.

With the structure, the first semiconductor chip 20 is electrically coupled to the solder ball 12 via the bump 22, the bonding pad 24, the connection portion 18 and the land electrode 14. On the other hand, the second semiconductor chip 40 and the third semiconductor chip 50 are electrically coupled to the solder ball 12 via the wires 42 and 52, the bonding pad 36, the connection portion 38, the land electrode 34, the solder ball 32, the land electrode 26, the connection portion 18 and the land electrode 14.

Japanese Patent Application Publication No. 2002-110902 discloses semiconductor chips flip-chip mounted and stacked on a wiring substrate and a metal substrate available on each back face of the semiconductor chips. Japanese Patent Application Publication No. 2000-12765 discloses stacked modules on a motherboard where the modules have a semiconductor chip flip-chip mounted on the substrate. Additionally, the reference discloses a via for heat radiation formed in the motherboard and the module substrate.

However, it may be difficult to dissipate the heat generated by the semiconductor chip at the bottom of a semiconductor device based on a stacked chip configuration. Especially, if the semiconductor chip at the bottom is flip-chip mounted and/or if the substrate on the back side of the flip-chip mounted semiconductor chip is metal, the heat generated by the semiconductor chip may not be satisfactorily dissipated as most of the heat is absorbed by the metal substrate, thus causing one or more problems in various components of the semiconductor device.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a semiconductor device comprising a first semiconductor chip that is flip-chip mounted on a first substrate, a heat absorption portion that is formed between the first semiconductor chip and the first substrate, an outer connection portion that connects the first semiconductor chip to an external device and a heat conduction portion formed between the heat absorption portion and the outer connection portion to dissipate heat generated by the first semiconductor chip.

As illustrated in the detailed description, other embodiments pertain to methods and structures that offer better management of heat generated by one or more components of semiconductor devices. Particularly, by implementing a heat absorption structure, a heat conduction structure and other forms of heat escape route in a semiconductor device in a stacked chip configuration, the embodiments provide an efficient escape route for heat generated by the semiconductor chip stacked at the bottom of the semiconductor device.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments offer techniques and structures for managing heat generated by one or more chips present in a stacked chip configuration. This is made possible by employing a number of heat dissipating structure such as a heat absorption portion, a heat conduction portion and a recess. The present invention is based on Japanese Patent Application No. 2006-353413 filed on Dec. 27, 2006, where the entire disclosure is hereby incorporated by reference.

First Embodiment

Figure 1:
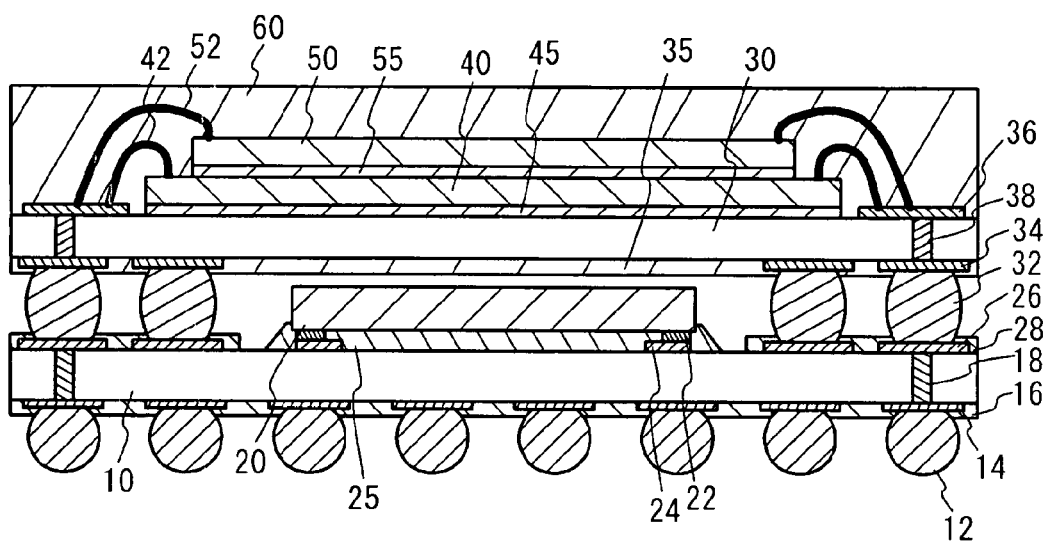
FIG. 1 illustrates a cross sectional view of a semiconductor device based on Package-on-Package (PoP) technology.
Figure 2:
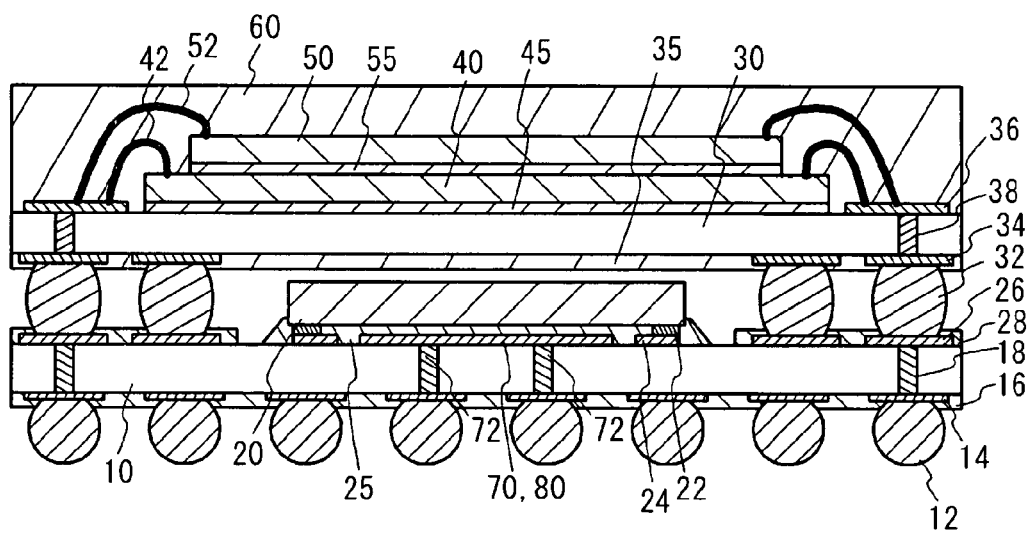
FIG. 2 illustrates a cross sectional view of a semiconductor device in accordance with the first embodiment of the present invention.

FIG. 2 illustrates a cross sectional view of a semiconductor device in accordance with the first embodiment of the present invention. A semiconductor device has a metal substrate 70 and a connection metal 72. In FIG. 2, the metal substrate 70 is provided between the first semiconductor chip 20 and the first substrate 10 and acts as a heat absorption portion 80. The connection metal 72 acts as a heat conduction portion which thermally connects the metal substrate 70 and the solder ball 12.

As shown in FIG. 2, the metal substrate 70 is implemented under the first semiconductor chip 20. The first substrate 10 is electrically and thermally connected to the metal substrate 70 and to the land electrode 14 with the connection metal 72 provided in a connection hole. The land electrode 14 is thermally connected to the solder ball 12 and dissipates heat. In one example embodiment, the connection metal 72, which is made of same material (e.g., gold, copper, etc.) as the connection portion 18 that connects the land electrode 26 or the bonding pad 24 to the land electrode 14.

In the structure illustrated in FIG. 2, there may be a case where heat is trapped due to a malfunction of the first semiconductor chip 20. For example, the temperature of the second semiconductor chip 40 may be increased if the heat generated due to the malfunction of the first semiconductor chip 20 is not properly dissipated. The structure illustrated in FIG. 2 may be effective in dissipating the heat, especially when the structure has several chips stacked. In addition, the structure in FIG. 2 may be more effective in dissipating the trapped heat where the second substrate 30 is arranged at a given interval from the first semiconductor chip 20.

It is preferable that the metal substrate 70, which is formed with gold and/or copper, acts as the heat absorption portion 80. In addition, it is preferable that the metal substrate 70 is made of the same material as the wire 27. This would reduce the manufacturing process by forming the metal substrate 70 together with the land electrode 26, the bonding pad 24 and the wire 27 when the first substrate 10 is manufactured. Further, it is preferable that the surface of the metal substrate 70 to be made of copper when the metal substrate 70, the land electrode 26 and the bonding pad 24 are made of copper or gold on copper since it is less adhesive between gold and an insulating film. Thus, the metal substrate 70 made of gold or gold alloy and the under fill 25 which is an insulating film remain non-adhesive. A copper layer is formed using a photo resist on a region where the metal substrate 70 is to be formed during the formation of copper on gold.

Figure 3:
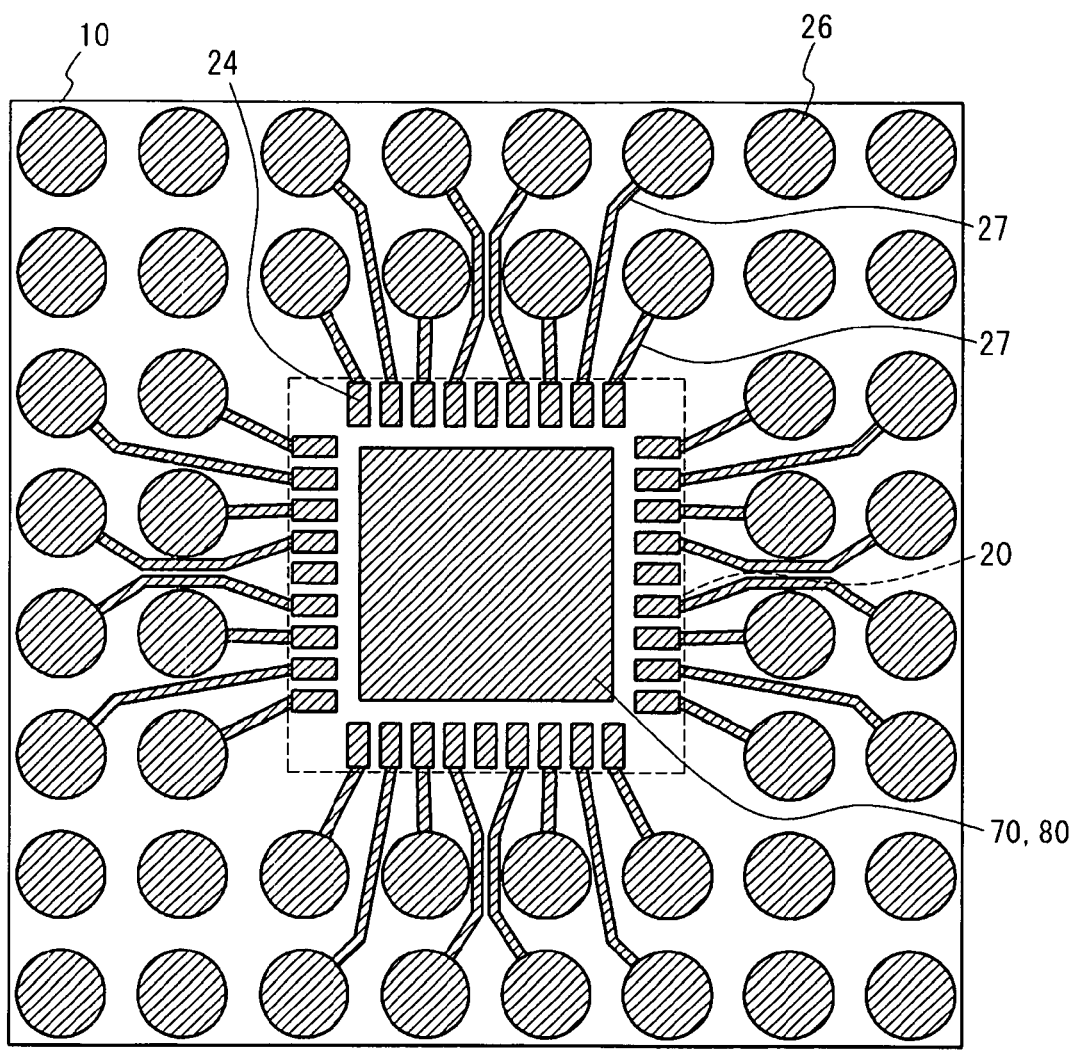
FIG. 3 illustrates a top view of the first substrate of the semiconductor device of FIG. 2 in accordance with the first embodiment.

FIG. 3 illustrates a top view of the first substrate of the semiconductor device of FIG. 2 in accordance with the first embodiment. As shown in FIG. 3, the land electrode 26 connected to the second substrate 30 of FIG. 2 is arranged on the peripheral area of the first substrate 10. The bonding pad 24 is connected to the bump 22 of the first semiconductor chip 20, and the heat absorption portion 80 neighbors a circuit region of the first semiconductor chip 20. Some of the land electrodes 26 and the bonding pads 24 are connected by wires 27. In one example embodiment, the metal substrate 70, the land electrode 26, the bonding pad 24 and the wire 27 are made of the same metal (e.g., copper, gold, etc.).

In one example embodiment, the heat generated in the first semiconductor chip 20 is efficiently absorbed in the metal substrate 70 that is formed under the circuit region. The connection metal 72 conducts the heat absorbed in the metal substrate 70 to the solder ball 12 which dissipates the heat. One or more of the connection metal 72 may be used to conduct the heat more efficiently from the metal substrate 70 to the solder ball 12. Furthermore, the connection metal 72 and the solder ball 12 may be connected to a ground or dummy terminal which is not electrically connected to any node.

Second Embodiment

Figure 4A:
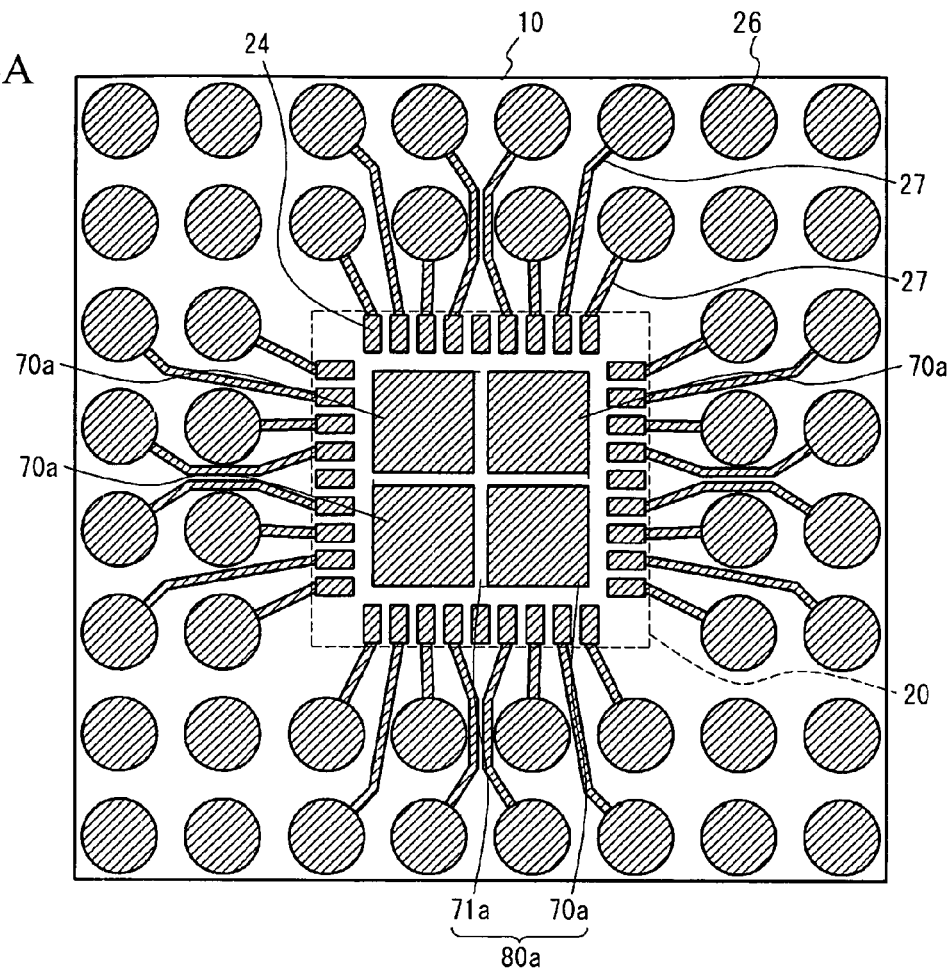
FIG. 4A illustrates a top view of the first substrate in a semiconductor device in accordance with the second embodiment.

FIG. 4A illustrates a top view of the first substrate in a semiconductor device in accordance with the second embodiment. In the second embodiment, the heat absorption portion includes an adhesion portion. FIG. 4A illustrates the top view of the first substrate 10 of a semiconductor device in accordance with the second embodiment. A heat absorption portion 80a has a space 71a between each metal substrate 70a. The metal substrate 70a has the same structure as the metal substrate 70 of FIG. 2. The metal substrates 70a are divided in four equal portions, thus exposing the surface of the first substrate 10.

In the semiconductor device in accordance with the second embodiment, the under fill 25 (e.g., the first insulating film) is positioned between the first semiconductor chip 20 and the heat absorption portion 80a, and a space 71b is formed between each of the metal substrates 70a and the heat absorption portion 80a, where the space 71b is acting as the adhesion portion to enhance the adhesion between the under fill 25 and the heat absorption portion 80a.

An adhesiveness between the under fill 25 acting as the first insulating film and the metal substrate 70a is reduced in a case where the metal substrate 70a includes a metal such as gold or copper. The space 71a acting as the adhesion portion is formed between each of the metal substrates 70a. Accordingly, the under fill 25 provides a contact to the first substrate 10 or the solder resist 28. Here, the adhesiveness between insulating films is stronger than one between an insulating film and a metal. Furthermore, the enlarged surface area of the metal substrate 70a increases the adhesiveness as well. The adhesion portion may be formed during the formation of the metal substrate 70a to maintain the duration of the manufacturing process.

Figure 4B:
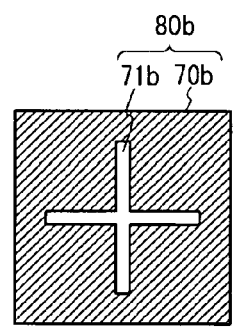
FIGS. 4B and 4C illustrate another example embodiment of the second embodiment.
Figure 4C:
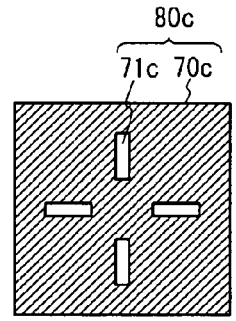

FIGS. 4B and 4C illustrate another example embodiment of the second embodiment. As illustrated in FIGS. 4B and 4C, a metal substrate 70b may remain intact and include a space 71b as illustrated in 4B. Alternatively, more than one space 71c may be formed in a metal substrate 70c, as illustrated in FIG. 4C.

Third Embodiment

Figure 5:
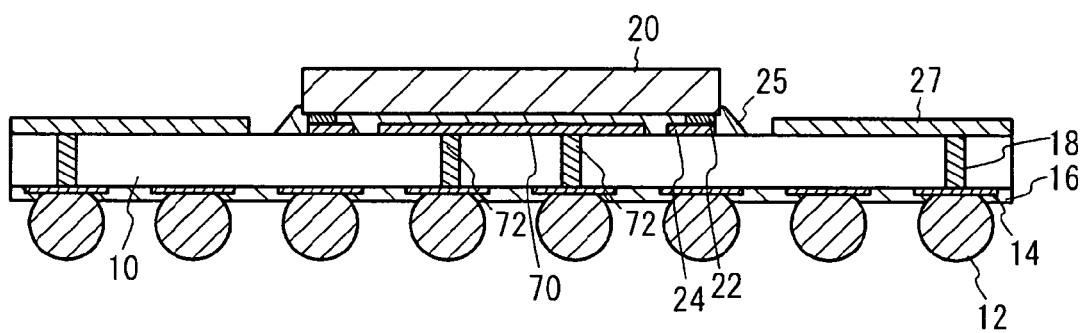
FIG. 5 illustrates a cross sectional view of a semiconductor device in accordance with the third embodiment.

FIG. 5 illustrates a cross sectional view of a semiconductor device in accordance with the third embodiment. In FIG. 5, the semiconductor device has only one semiconductor chip mounted. In one example embodiment, the heat generated in the flip-chip mounted first semiconductor chip 20 is dissipated using the metal substrate 70 and the connection metal 72. And the adhesion portion may be provided in the heat absorption portion 80, as is the case of the second embodiment.

Fourth Embodiment

Figure 6:
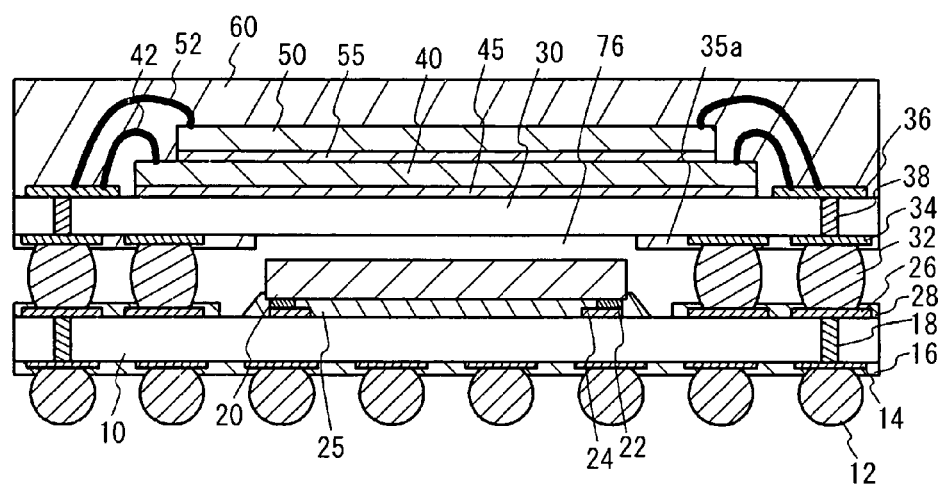
FIG. 6 illustrates a cross sectional view of a semiconductor device in accordance with the fourth embodiment.
Figure 7:
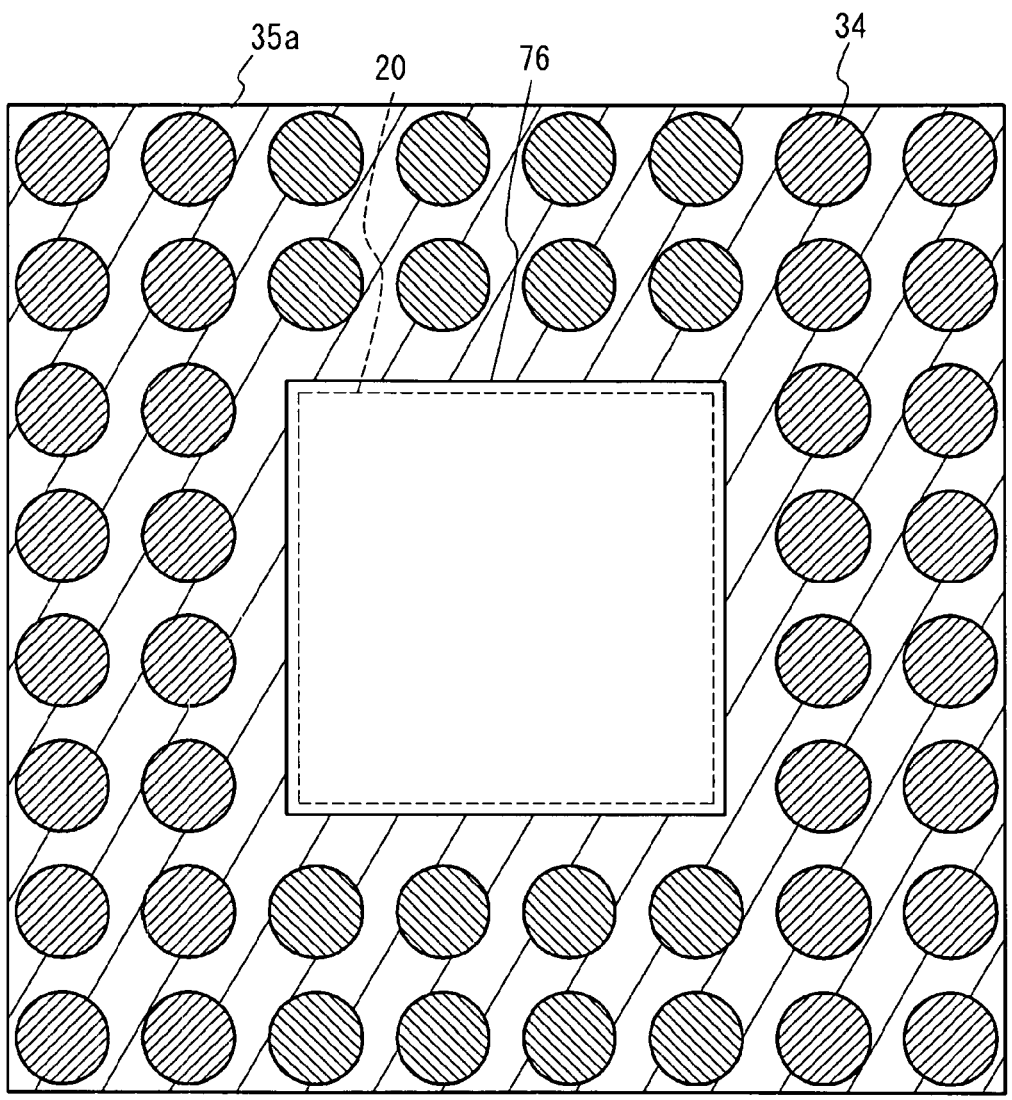
FIG. 7 illustrates the top view of a second substrate.

In the fourth embodiment, a recess is formed on the face of the second substrate 30 on the side of the first semiconductor chip 20. FIG. 6 illustrates a cross sectional view of a semiconductor device in accordance with the fourth embodiment. FIG. 7 illustrates the top view of the second substrate 30. As shown in FIG. 6, a solder resist 35a (the second insulating film) is formed on the edges of the second substrate 30 facing the first semiconductor chip 20. The solder resist 35a has an opening portion 76, which is the recess of the second substrate 30, on a region directly above the first semiconductor chip 20.

As shown in FIG. 7, the solder resist 35a covers the bottom surface of the second substrate, except the area above the first semiconductor chip 20. The solder resist 35a has an opening for the land electrode 34 to form the solder ball 32 and the opening portion 76 formed on the first semiconductor chip 20. The opening portion 76 includes a region, which is illustrated with the dotted line in FIG. 7, of the second substrate 30 where the first semiconductor chip 20 is projected. Another opening portion may be formed to act as an acknowledgement mark for the land electrode 34.

In accordance with the fourth embodiment, the second substrate 30 has a recess (e.g., the opening portion 76) based on the second insulating film (e.g., the solder resist 35a) formed above the peripheral area of the first semiconductor chip 20. The space between the first semiconductor chip 20 and the second substrate 30 becomes larger due to the second insulating film. Accordingly, the heat generated in the first semiconductor chip 20 may be effectively dissipated through the opening portion. It is preferable that the opening portion 76 is larger than the region, which is illustrated with the dotted line in FIG. 7, of the second substrate 30 because the heat generated in the first semiconductor chip 20 is dissipated more efficiently. Alternatively, the opening portion 76 may be smaller than the region. Furthermore, the opening portion 76 may be formed on the solder resist 35a during the formation of the opening portion for the land electrode 34.

Fifth Embodiment

Figure 8A:
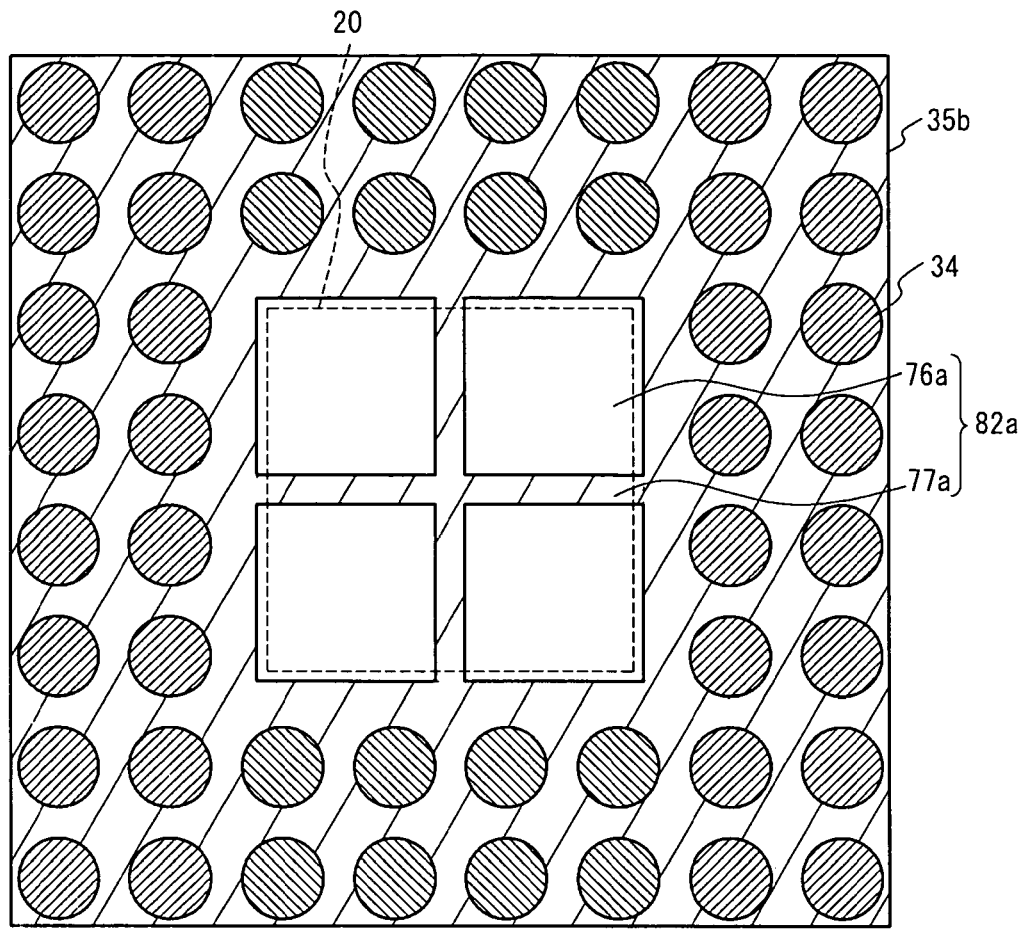
FIG. 8A illustrates a top view of a second substrate of a semiconductor device in accordance with the fifth embodiment.

FIG. 8A illustrates a top view of the second substrate 30 of a semiconductor device in accordance with the fifth embodiment. As shown in FIG. 8A, one or more opening portions 76a are formed on a solder resist 35b. The solder resist 35b is present in the region between the opening portions 76a. That is, a convex portion 77a (e.g., a protrusion) is present in a recess 82a of the second substrate 30.

Figure 8B:
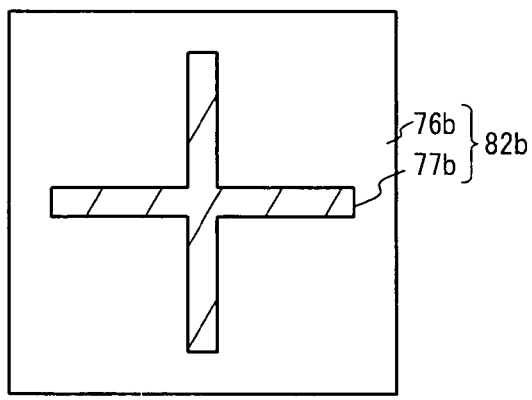
FIG. 8B illustrates another example embodiment of the fifth embodiment.

A bending strength of the second substrate 30 is degraded if the recess of the second substrate 30 becomes larger. In the fifth embodiment, the convex portion 77a strengthens the second substrate 30. The convex portion 77a may be formed during the formation of the recess 82a. In an alternative example embodiment, a convex portion 77b may be isolated from the rest of the soldier resist 35b as illustrated in FIG. 8B.

Sixth Embodiment

Figure 9:
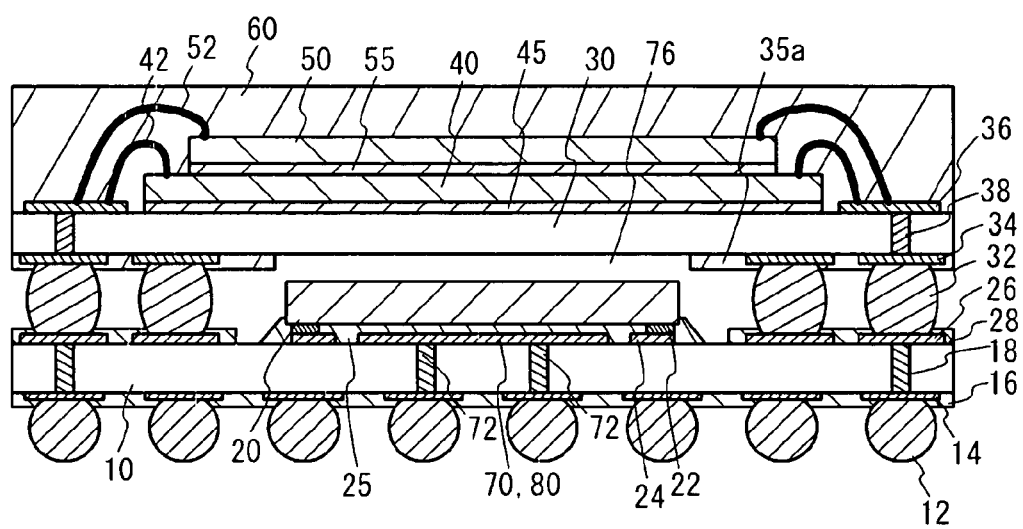
FIG. 9 illustrates a cross sectional view of a semiconductor device in accordance with the sixth embodiment.

FIG. 9 illustrates a cross sectional view of a semiconductor device in accordance with the sixth embodiment. As shown in FIG. 9, the metal substrate 70 and the connection metal 72 are implemented to the semiconductor device as well as the recess of FIG. 6. The heat generated in the first semiconductor chip 20 may be dissipated more efficiently since the semiconductor device has a heat absorption portion (e.g., the metal substrate 70), a heat conduction portion (e.g., the connection metal 72) and a recess (e.g., the opening portion) created by the solder resist 35 of the second substrate 30. Additionally, an adhesion portion (e.g., the space 71a of FIG. 4A) and a strengthening portion (e.g., a convex 77a of FIG. 8A) may be included in the semiconductor device.

In one example embodiment, the semiconductor chip 20 is a semiconductor chip having a logic IC, and the second and third semiconductor chips are memory chips. Since the logic IC generates more heat, more pads are needed for the chip, which is often smaller than the memory chips. It is therefore preferable that the logic IC semiconductor chip is the first semiconductor chip 20 with the heat absorption portion and the heat conduction portion. And it is also preferable that the logic IC is the first semiconductor chip 20 that can be connected to many pads. It is further preferable that the logic IC is mounted between the solder balls 32.

Figure 10:
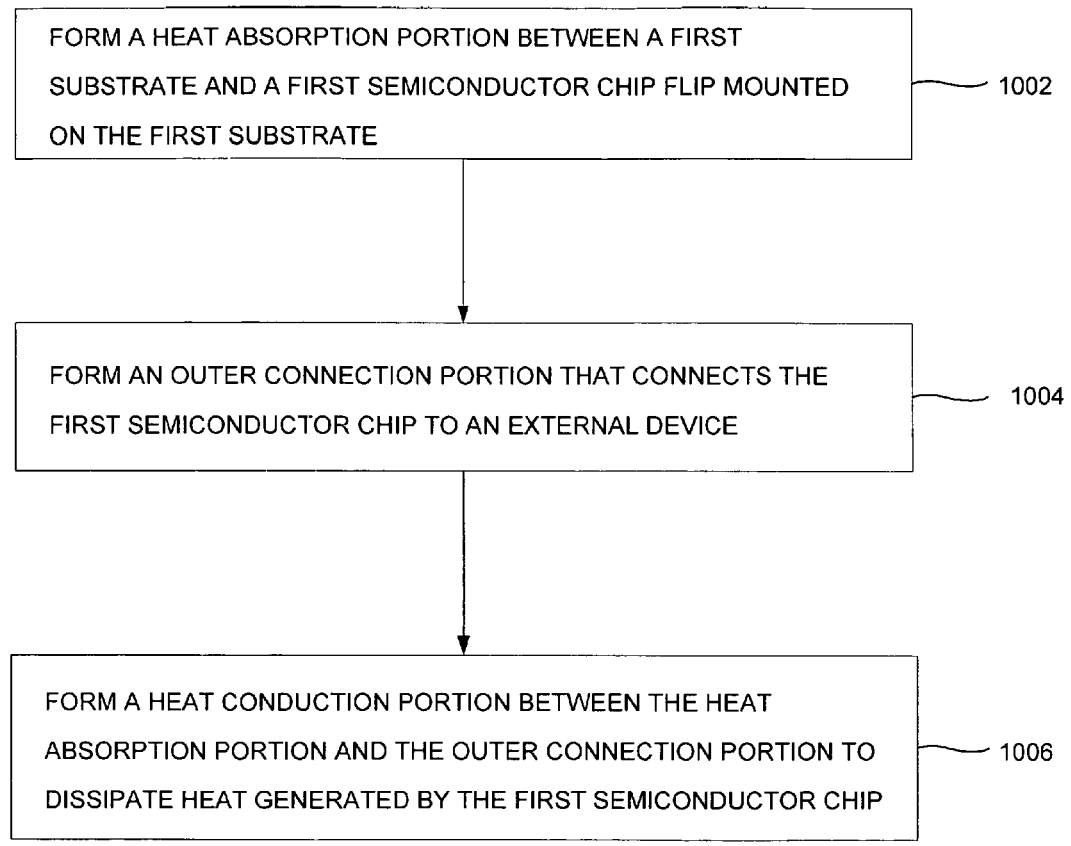
FIG. 10 illustrates a method of forming a heat dissipation structure in a semiconductor device, according to one embodiment.

FIG. 10 illustrates a method of forming a heat dissipation structure in a semiconductor device, according to one embodiment. In operation 1002, a heat absorption portion is formed between a first substrate and a first semiconductor chip flip mounted on the first substrate. In operation 1004, an outer connection portion that connects the first semiconductor chip to an external device is formed. In operation 1006, a heat conduction portion is formed between the heat absorption portion and the outer connection portion to dissipate heat generated by the first semiconductor chip. In addition, a second substrate is formed above the first semiconductor chip in an exemplary implementation. Moreover, a recess is formed on the second substrate above edges of the first semiconductor chip by applying a second insulating film (e.g., a solder resist) on edges of the second substrate facing the edges of the first semiconductor chip.

It is appreciated that the heat absorption portion, the heat conduction portion, the outer connection portion (e.g., the solder ball), the adhesion portion, the recess, the convex portion may be realized through structures other than the ones described here.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method, comprising:
    forming a heat absorption portion between a first substrate and a first semiconductor chip flip mounted on the first substrate, wherein forming the heat absorption portion comprises forming one or more spaces in the heat absorption portion;
    forming an outer connection portion that connects the first semiconductor chip to an external device; and
    forming a heat conduction portion between the heat absorption portion and the outer connection portion to dissipate heat generated by the first semiconductor chip.

2. The method of claim 1, further comprising forming a second substrate above the first semiconductor chip.

3. The method of claim 2, further comprising forming a recess on the second substrate above edges of the first semiconductor chip.

4. The method of claim 3, wherein the recess is formed by applying a second insulating film on edges of the second substrate facing the edges of the first semiconductor chip.

5. The method of claim 4, wherein the second insulating film is made of a solder resist.

6. The method of claim 3, wherein forming the recess of the second substrate comprises forming an opening portion on the second insulating film.

7. The method of claim 2 further comprising mounting a second semiconductor chip on the second substrate.

8. The method of claim 7, wherein the second semiconductor chip comprises a memory chip.

9. The method of claim 1 further comprising forming a first insulating film between the first semiconductor chip and the heat absorption portion.

10. The method of claim 1, wherein the heat absorption portion comprises an adhesion portion that aids an adhesion between the first insulating film and the heat absorption portion.

11. The method of claim 1, wherein at least one of the heat absorption portion and the heat conduction portion is made of a metal.

12. The method of claim 11, wherein the metal comprises at least one of copper and gold.

13. The method of claim 1, wherein the first semiconductor chip comprises a logical integrated circuit.

* * * * *